United States Patent
Krüger et al.

(10) Patent No.: US 7,215,119 B2
(45) Date of Patent: May 8, 2007

(54) METHOD AND MR APPARATUS FOR DYNAMIC FREQUENCY DETECTION IN MR SPECTROSCOPY

(75) Inventors: Gunnar Krüger, Erlangen (DE); Stefan Röll, Seigendorf (DE)

(73) Assignee: Siemens Aktiengesellschaft, Munich (DE)

( * ) Notice: Subject to any disclaimer, the term of this patent is extended or adjusted under 35 U.S.C. 154(b) by 2 days.

(21) Appl. No.: 11/119,470

(22) Filed: Apr. 29, 2005

(65) Prior Publication Data

US 2005/0248343 A1 Nov. 10, 2005

(30) Foreign Application Priority Data

Apr. 30, 2004 (DE) .................... 10 2004 021 771

(51) Int. Cl.
*G01V 3/00* (2006.01)
(52) U.S. Cl. .................... 324/312; 324/306
(58) Field of Classification Search .............. 324/312, 324/306, 307

See application file for complete search history.

(56) References Cited

U.S. PATENT DOCUMENTS

| | | | | |
|---|---|---|---|---|
| 4,684,889 A | | 8/1987 | Yamaguchi et al. | |
| 5,800,354 A | * | 9/1998 | Hofland et al. | 600/410 |
| 6,321,107 B1 | * | 11/2001 | Derbyshire | 600/410 |
| 6,528,996 B1 | * | 3/2003 | Sato | 324/307 |
| 6,586,935 B1 | * | 7/2003 | Ma et al. | 324/312 |
| 2002/0145424 A1 | | 10/2002 | Uetake | |

OTHER PUBLICATIONS

Patent Abstracts of Japan Publication No. 05023318 A for Japanese Application 199100020220.
"Field-Frequency Locked In Vivo Proton MRS on a Whole-Body Spectrometer," Henry et al., Magnetic Resonance in Medicine, vol. 42 (1999) pp. 636-642.
"Phase Coherent Averaging in Magnetic Resonance Spectroscopy Using Interleaved Navigator Scans: Compensation of Motion Artifacts and Magnetic Field Instabilities," Thiel et al., Magnetic Resonance in Medicine, vol. 47 (2002) pp. 1077-1082.

* cited by examiner

*Primary Examiner*—Louis M. Arana
(74) *Attorney, Agent, or Firm*—Schiff Hardin LLP

(57) ABSTRACT

In a method for dynamic frequency detection of the resonance frequency in magnetic resonance spectroscopy, by measuring navigator signals at the same point in time in each of a number of successive sequence passes, and by comparing the navigator signals, a frequency shift of the resonance frequency is determined on the basis of which the respective individual spectrum obtained from each sequence repetition is corrected with respect to the measured frequency shift.

8 Claims, 3 Drawing Sheets

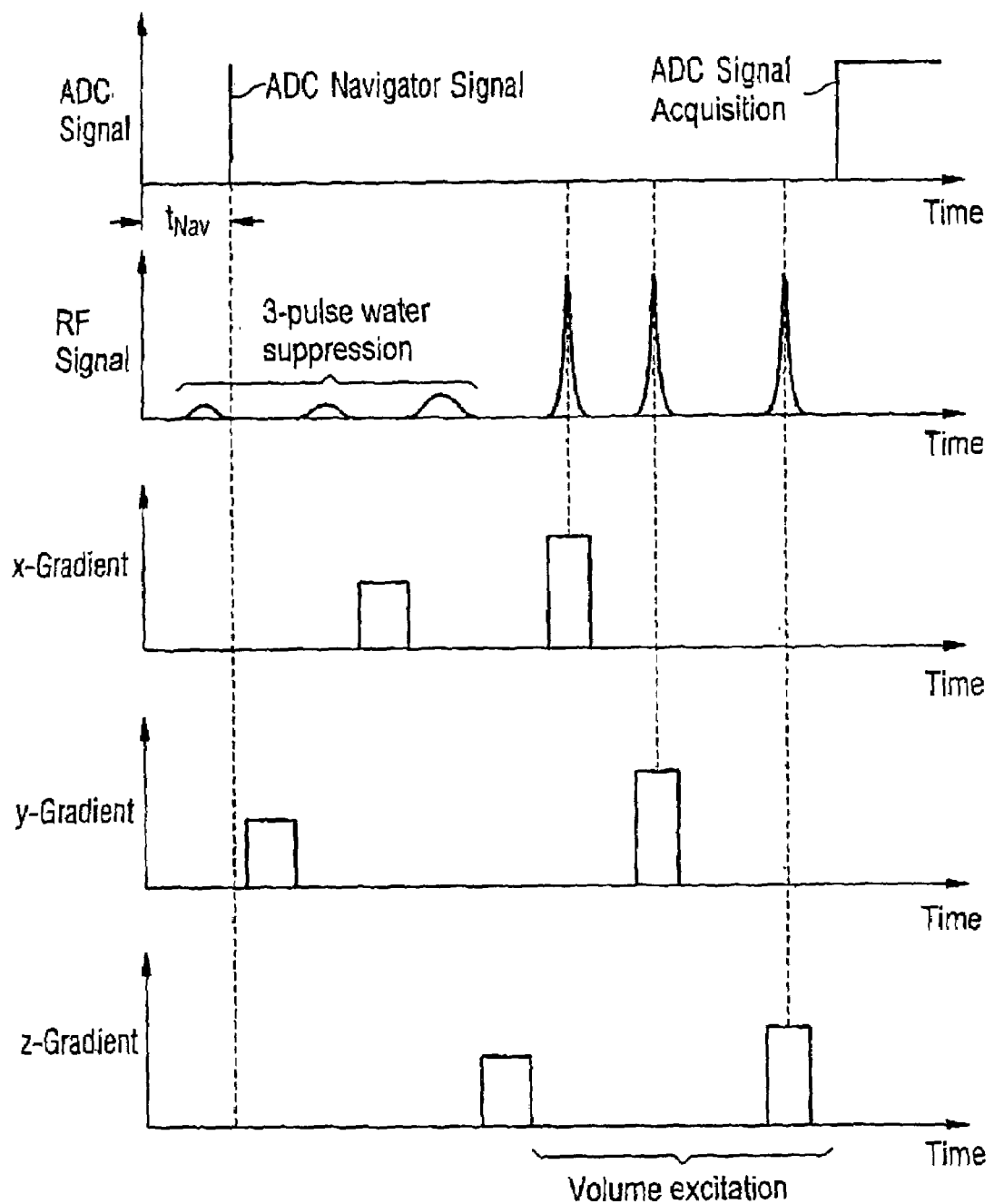

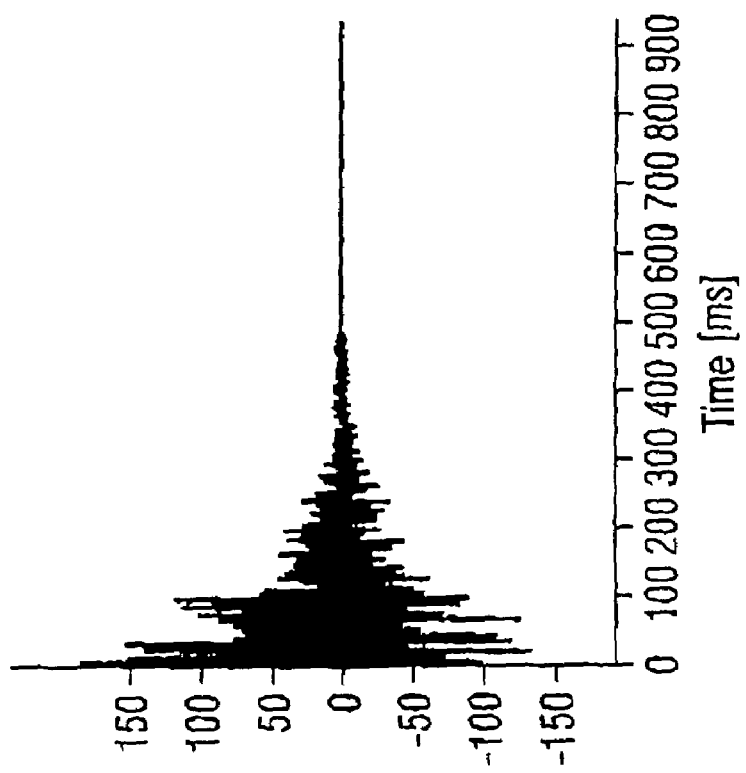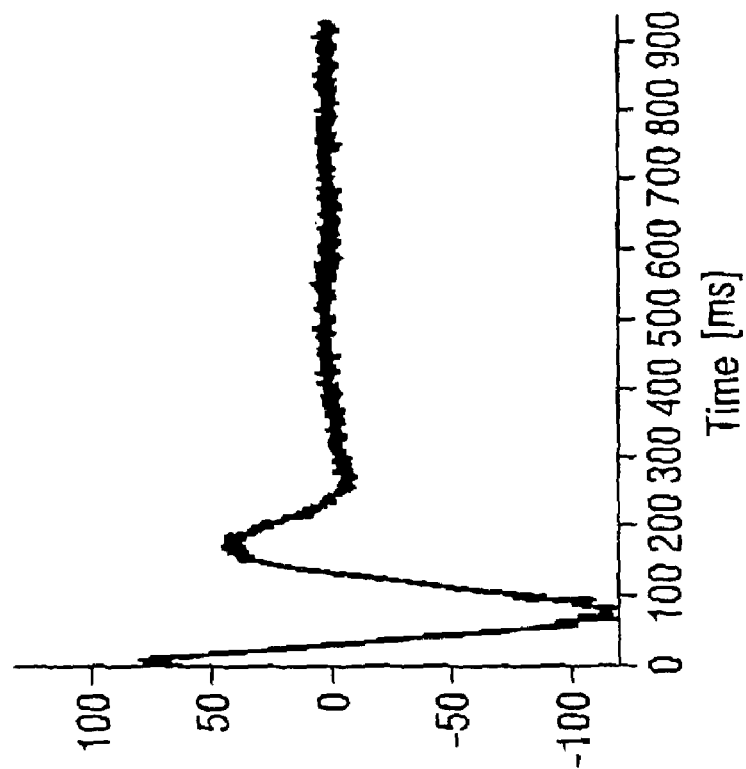

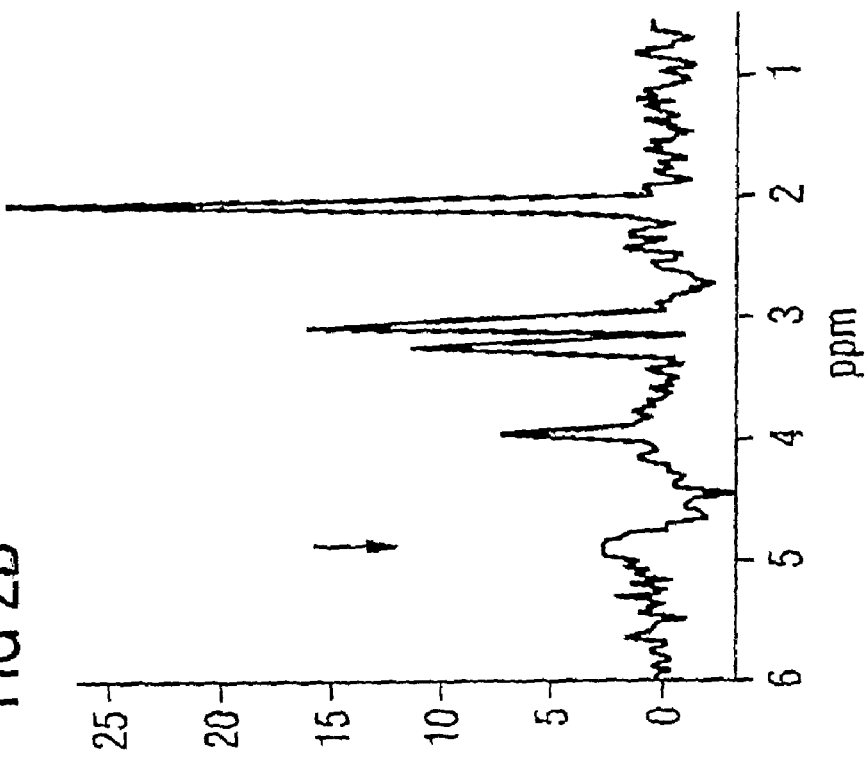
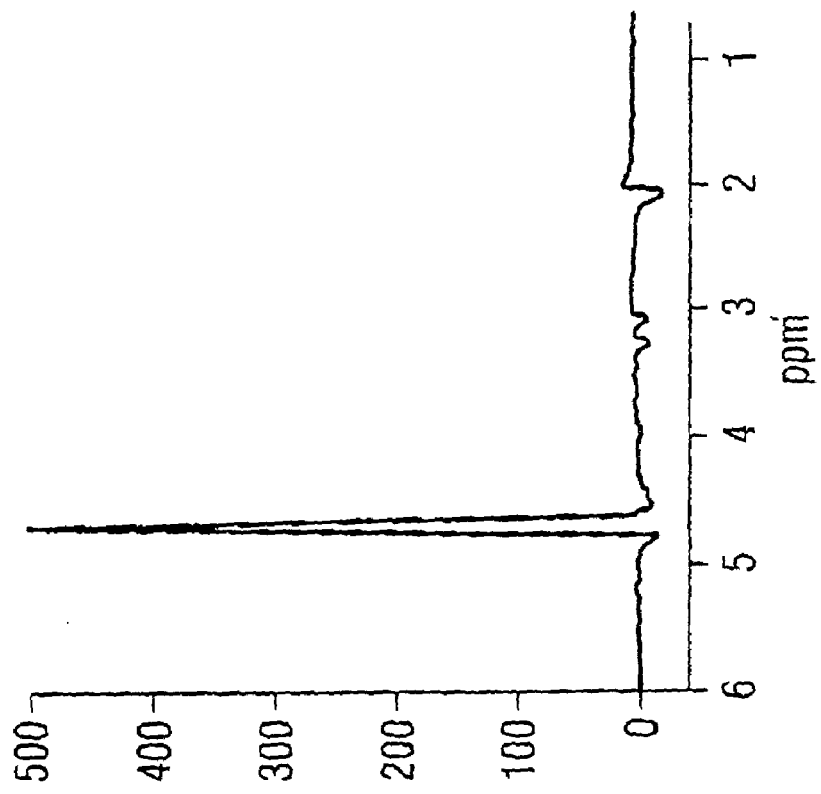

METHOD AND MR APPARATUS FOR DYNAMIC FREQUENCY DETECTION IN MR SPECTROSCOPY

BACKGROUND OF THE INVENTION

1. Field of the Invention

The present invention relates generally to magnetic resonance spectroscopy (MRS), as used in the field of medicine for the examination of biochemical or metabolic processes in the human body. The present invention relates in particular to a method for determining and correcting the frequency drift of the resonance frequency during the acquisition of the image series of an individual spectrum.

2. Description of the Prior Art

Magnetic resonance spectroscopy (MRS) is based, as is magnetic resonance tomography (MRT), on the phenomenon of nuclear spin resonance, discovered in 1946, which was first used in basic research to measure the magnetic properties of nuclei. When it was first noted in the 1960s that the magnetic resonance signal (MR signal) of a nucleus is also influenced by its chemical environment, and that this chemical shift can be used to characterize chemical substances, high-resolution NMR in the test tube was established. This has been successfully used ever since in physical, chemical, biochemical, and pharmaceutical research and for the analysis, i.e., structural analysis, of complex macromolecules.

In the early 1980s, it was discovered that, due to its dependence on its chemical environment (water-containing tissue, or fatty tissue), the magnetic resonance signal can form the basis for a non-Invasive imaging technique, which, as magnetic resonance tomography (MRT), today continues to be one of the most important examination methods in the field of medicine.

However, it was not overlooked that the imaging signals in magnetic resonance tomography additionally contain chemical information that can be evaluated for the investigation of biochemical reactions or of metabolic processes in a living body. This spatially resolved spectroscopy in the living organism or in the living organ was named "in vivo spectroscopy" (MRS), or "clinical magnetic resonance spectroscopy" in contrast to high-resolution NMR in the test tube, which generally takes place in the laboratory, or in contrast to magnetic resonance tomography (MRT) used purely for imaging.

In the following, the basic physical principles of nuclear spin resonance are briefly explained:

In both MRS and MRT, the subject to be examined (patient or organ) is exposed to a strong, constant magnetic field. This causes the nuclear spins of the atoms in the subject, which were previously oriented randomly, to become aligned. Radio-frequency energy can now excite these "ordered" nuclear spins to a particular oscillation (Lamor precession of the magnetization as a macroscopic quantity). In both MRT and MRS, this oscillation produces the actual measurement signal, which is acquired by means of suitable reception coils. Using non-homogenous magnetic fields, produced by gradient coils, the measurement subject can be spatially coded in all three spatial directions, which is called "spatial coding" in MRT or "volume excitation" in MRS.

The acquisition and organization of the data in MRS/MRT takes place in k-space (frequency domain). The MR spectrum or the MRT image, both in the image domain, are linked with the measured k-space data by means of Fourier transformation.

The volume excitation of the subject takes place by means of slice-selective radio-frequency excitation pulses in all three spatial directions. Generally, these are three sinc-shaped, Gaussian-shaped, or hyperbolic RF pulses that are radiated into the examination subject simultaneously in combination with rectangular or trapezoidal gradient pulses. The radiation of the RF pulses takes place using RF antennas.

By the combination of these pulses, a frequency spectrum in the range of the resonance frequency that is specific for a type of nucleus is radiated into a defined region, which generally is cuboid, of the subject being examined. The nuclei in the selected region (voxel of interest, or VOI) react to this excitation with electromagnetic response signals, which, in the form of a sum signal (FID signal) are detected in a special receive mode of the mentioned RF antennas. Through the switching of an analog-digital converter, the analog signal is sampled, digitized, and stored in a computing unit or is Fourier-transformed, so that a spectrum can be represented on a visualization unit (monitor).

Each type of atomic nucleus has a specific constant (gyromagnetic ratio $\gamma$) that defines the resonance frequency of the nucleus type in a given magnetic field according to the relation $$v = \frac{\gamma}{2\pi}|\vec{B}|$$

and on the basis of which it can be recognized in a given magnetic field. In medical technology, magnetic basic fields of 0.5–3.0 Tesla are standardly produced, while analytical NMR uses fields up to 19 Tesla, though with much smaller magnets.

Thus, protons (i.e., individual unbound hydrogen nuclei, 1H) in a magnetic field having strength 1.5 T emit signals at 63.8 MHz, while carbon—13 nuclei (13C) display resonance at 16.1 MHz, and phosphorus—31 nuclei (31P) display resonance at 26 MHz. The signals of the different types of nuclei therefore can be clearly separated from one another, and it makes sense to designate the respective experiment as proton spectroscopy, 13C spectroscopy, or phosphorus spectroscopy.

The chemical environment of an atomic nucleus, in particular the bonding electrons, causes minimal changes of the magnetic field strength inside a molecule (designated above as "chemical information"), and thus causes variations—very slight but measurable—of the resonance frequencies of identical atomic nuclei in the Hz range. If the response signals of a substance located in an externally homogenous magnetic field are sorted by frequency and plotted, there results on the abscissa a spectrum of different chemical shifts $\delta$, and thus of different molecules.

This shift $\delta$ is indicated in millionths of the resonance frequency (ppm=parts per million), according to the formula $$\delta = \frac{v_{substance} - v_0}{v_0}$$

and is thus independent of the magnetic field strength. Nonetheless, magnetic resonance spectra are dependent on the magnetic field strength of the basic field, because higher field strengths both separate the individual resonances better and also yield a better signal-to-noise ratio (SNR). Most spectroscopy-capable MR systems in clinical use operate at 1.5 to 3 Tesla. Equally as important as the magnitude of the magnetic field strength are its homogeneity and stability, in order finally to enable measurement of frequency differences of 1 Hz at a basic frequency of 63.8 MHz (1H, or hydrogen).

As mentioned above, clinical MR spectroscopy is understood as meaning MR spectroscopy of living patients, which, often as a supplement to MR tomography, supplies more detailed information concerning the metabolic composition of the tissue being examined, and enables in vivo examinations of metabolic processes in the human being. In clinical MR spectroscopy, a wide range of metabolites (products resulting from metabolism or converted in the metabolic process) are detected whose existence and concentration can provide information about neuronal functionality, metabolic changes and pathological changes in the brain, muscle tissue, and other organs.

Due to the low concentration of the metabolites, limits exist for the volume excitation depending on the type of nucleus, duration of exposure, and the organ. Typical measurement volumes in 1H MRS are approximately 2 $cm^3$, in 31P MRS approximately 30 $cm^3$, and in 13C MRS even more than 30 $cm^3$. For the recording an information-rich evaluable spectrum with a correspondingly high SNR, a large number of sequence passes, i.e., a large number of successive individual measurements that are subsequently summed, is often required. Usually, this is up to 500 measurements, lasting several minutes overall.

During this comparatively long acquisition time of up to several minutes, the individual spectra to be recorded are exposed to external influences (e.g., hardware imperfections, temperature changes of the electronic components used), which can cause a change of the resonance frequency of up to a few Hz per hour; this can have a significant, possibly negative influence on the quality of the overall spectrum as the mean value of the individual spectra.

In addition, particularly in proton spectroscopy (1H MRS), there is the additional factor that the dominant water signal of the cellular tissue, which is ubiquitous and present in a high concentration, is suppressed by a special acquisition sequence in order to make visible the considerably (by one to two orders of magnitude) weaker signals (e.g. creatine, choline, carnitine, etc.) that are distributed over a range of several ppm. A standard method for known as water suppression is the CHESS technique (CHEmical Shift Selective Saturation, also called 3-pulse suppression), in which the nuclear spins of the water molecules are first selectively excited by 90° RF pulses and their cross-magnetization is subsequently dephased through the switching of magnetic field gradients (in all three spatial directions: x-, y-, and z-gradients). For an immediately subsequent spectroscopy method (for example an immediately subsequent volume excitation), in the ideal case there is thus no longer any detectable magnetization of the water molecules. In reality, a slight residual water magnetization remains, which is tolerable in the context of the signal-to-noise ratio (signal level of the 1H metabolites of interest relative to the baseline).

A first approach in the prior art, in order to enable a shift of the individual spectra due to frequency drift in 1H spectroscopy to be taken into account, is to carry out the water suppression in such a way that a significant water signal (in the form of a peak in the spectrum) remains from which information can be derived for frequency shifts. A disadvantage of this method is that metabolites close to water are situated at the broad foot of the water line, and additional post-processing steps are required to recreate at least the visual impression of an MR spectrum (peaks on a horizontal baseline). A further disadvantage of this method is that when there is a drift of the system frequency the quality of the water suppression is also adversely affected; this method thus is not very robust.

Some researchers have proposed that, after a defined number of repetitions during which the frequency shift can be neglected or linearly interpolated (sequence packet e.g. after the acquisition of 10 individual spectra), a single measurement should be carried out in the form of a reference scan, through which exclusively the exact frequency position of the water signal is determined. Such a sequence series is carried out until a usable spectrum has been obtained. The respective reference measurements supply a basis on which all the repetition cycles (sequence packet) can be corrected relative to one another. A disadvantage of this method is the increased time requirement for the additional reference measurements, which in the end makes this method unattractive.

It has also been attempted to minimize the overall measurement time of the spectroscopy measurement in order to keep the influence of frequency changes as small as possible. However, this results in strong saturation effects, which ultimately further worsens the signal-to-noise ratio, which is already poor due to the shortening of the measurement time.

In sum, the problem of frequency drift correction in 1H spectroscopy currently has not been satisfactorily solved.

SUMMARY OF THE INVENTION

An object of the present invention is to provide a method by which a frequency drift in MR spectroscopy with water suppression can easily be diagnosed and corrected.

According to the present invention, this object is achieved by a method for dynamic frequency detection of the resonance frequency in magnetic resonance spectroscopy experiments, wherein by measuring navigator signals at the same respective point in time in each of a number of successive sequence passes, and by comparing the navigator signals, a frequency shift of the resonance frequency is determined, on the basis of which the respective individual spectrum obtained from each sequence pass is corrected with respect to the measured frequency shift.

In the case of a proton spectroscopy the magnetic resonance spectroscopy examination is carried out with water suppression.

In addition, in the case of a multiple-pulse water suppression it is advantageous to cause the navigator signal to take place immediately after the first RF saturation pulse.

Here, it is advantageous to switch the analog-digital converter, and thus the duration of the navigator signal, on the order of magnitude of 100 μs, or to limit the analog-digital conversion data acquisition according to the present invention to the order of magnitude of 10 analog-digital conversion measurement values.

In an embodiment of the present invention, the analog-digital converted measurement values for each navigator signal are arranged.

In a further embodiment of the present invention, averaging over all the corrected individual spectra is done.

The present invention also encompasses an apparatus that is suitable for carrying out the inventive method.

DESCRIPTION OF THE DRAWINGS

FIG. 1 schematically shows an MR spectroscopy sequence according to the present invention, with 3-pulse water suppression and a navigator signal.

FIG. 2a schematically shows an FID signal dominated by water protons in the time domain.

FIG. 2b schematically shows a 1H FID signal of the 1H metabolites in the time domain with water suppression.

FIG. 2c schematically shows a resonance curve dominated by water protons in the frequency domain.

FIG. 2d schematically shows a resonance curve of the 1H metabolites in the frequency domain with water suppression.

DESCRIPTION OF THE PREFERRED EMBODIMENTS

Examination of tissue by means of magnetic resonance spectroscopy supplies a damped magnetic resonance signal (MR signal) that oscillates periodically with the Lamor frequency, known as the free induction decay (FID), as shown for example in FIGS. 2a and 2b. The FID signal is, roughly, the electromagnetic response to a radio-frequency excitation pulse that was previously radiated into the tissue under examination. As mentioned above, the irradiated RF excitation pulse represents a frequency spectrum in the MHz range that extends over the expected resonance range of the metabolites. In proton spectroscopy, this is a range of 10 ppm at approximately 60 MHz; the spectral width in phosphorus spectroscopy is approximately 30 ppm at 26 MHz; and in 13C spectroscopy the resonances in the spectra are distributed over a range of 200 ppm at approximately 16 MHz.

The FID signal itself is a chronologically dependent response signal in whose frequency curve all the resonances of the excited nuclei in the respective metabolites are frequency-coded. This coding can be broken down by a Fourier transformation and sorted by resonance frequencies. The Fourier transform of the FID is designated in general as a resonance curve, and the term "absorption spectrum" has also come to be used in MR spectroscopy. In the remainder of the present specification, the representation of the magnetic nuclear resonance signals in the time domain will be designated as the MR signal, and in the frequency domain as the resonance curve or spectrum.

The techniques that can be used to select the volume in which the MR signal is to be measured are at least partly the same as in MR tomography, i.e., for imaging, where a magnetic resonance signal is also assigned a particular location.

Using gradients, i.e. spatially different magnetic field strengths produced by gradient coils outside the body, arbitrary volumes in the interior of the body can be selected and excited. A wide variety of techniques and combinations exist as to how these gradients are switched, i.e., when, how long, and how strongly, in combination with the respective RF excitation pulses. The simplest volume selection method standardly consists in the successive radiation of three spectral 90° RF pulses, a gradient pulse of the respective spatial direction (x-, y-, z-direction) being switched simultaneously with each RF pulse. Such RF pulses are called slice-selective pulses. In this way, three slices orthogonal to one another are excited, so only the slice volume where all three slices coincide is adequately excited, so that only this volume supplies a signal. This signal is read out through an analog-digital converter (ADC).

For larger volumes as well, a single measurement of the FID signal is generally not sufficient to obtain significant peaks in the spectrum relative to the background noise. Usually, a large number of sequence repetitions must be executed, and the individual spectra belonging to each sequence repetition are added together. The required large number of sequence repetitions results in a comparatively long overall exposure time (up to several minutes), during which apparatus-specific disturbances have a significant influence on the individual spectra to be recorded. Thus, a drift of the resonance frequency during the measurement results in a shifting of the individual spectra relative to one another that were respectively acquired in the successive repetitions, resulting in a significant spreading of the signal during the spectrum addition. The inventive method allows a resonance frequency drift during the measurement to easily be taken into account and used for correction.

An additional complicating factor in 1H spectroscopy is that, as explained above, the water signal of the cellular tissue dominates in relation to the metabolite signals by several orders of magnitude, and has to be suppressed before the actual volume excitation, with subsequent measurement, by an additional, time-consuming sequence step. Without suppression of the water signal, the resonances of the metabolites do not appear in the resonance curve. This fact is illustrated in FIGS. 2a to 2d:

FIG. 2c schematically shows a resonance curve dominated by "free" water protons in the frequency domain, obtained by Fourier transformation from the ADC signal of FIG. 2a. The signal of water in both curves (ADC signal and resonance curve) is so dominant that frequencies or resonances of 1H metabolites can barely be seen. FIG. 2b schematically shows an ADC signal that was acquired with water suppression. The signal clearly shows the exponential decay as an envelope in which the resonances of 1H metabolites are frequency-coded. The Fourier transformation of the curve from FIG. 2b results in a spectrum, shown in FIG. 2d, in which the resonance of water (black arrow) appears as significantly suppressed in relation to the 1H metabolites to the right of the water resonance.

The sequence step of a water suppression consists in a sequence of RF and gradient pulses similar to that in volume excitation, but the RF pulses are not slice-selective (I.e, the gradient pulses are not radiated simultaneously with the RF pulses), and moreover have a specific chronological spacing and specific amplitude relations relative to one another. This leads to an additional significant lengthening of the measurement duration, further increasing the sensitivity of a spectroscopy measurement with water suppression. Moreover, under practical boundary conditions, with this relatively simple method water suppression factors between 30 and 80 typically can be achieved, which for many applications is not only sufficient but is necessary for resonances of 1H metabolites to be significantly represented in the spectrum at all. The fact that the water signal can never be completely suppressed is not necessarily a disadvantage.

FIG. 1 shows a typical MRS sequence in the form of a conventional volume excitation that precedes a 3-pulse water suppression. After the volume excitation, the ADC is switched in such a way that the FID signal occurring immediately after the third slice-selective RF pulse is acquired (sampled). As can be seen on the basis of FIG. 1, such a water suppression (here a 3-pulse suppression) results in a significant chronological prolongation of the measurement sequence (by a factor of 2 to 3).

In accordance with the invention the data acquisition of a known MR spectroscopy sequence with water suppression are expanded by a navigator signal by brief activation of the ADC. It is important that the navigator signal always occur after the same time segment $t_{Nev}$ relative to the beginning of the sequence. In addition, it is advantageous to keep the navigator signal very short (for example 50 to 100 µs), so that the ADC acquires approximately 10 values in terms of order of magnitude, over which averaging can possibly be carried out (other values are also conceivable). If, according to FIG. 1, a 3-pulse suppression is considered, it is advantageous to sample the navigator signal between the first and the second RF suppression pulse. In this way, in each sequence pass the ADC measures a few data points, at respectively the same point in time (complex values, frequency-coded), that contain the incompletely suppressed resonance signal of water. As complex values, the respective ADC values (possibly averaged) have a phase θ that differs from sequence to sequence in the case of a drift of the resonance frequency.

By comparing the phases of the respective (averaged) navigator signal values of each individual spectrum (for example by complex conjugated multiplication), according to $$\Delta v = \frac{\Delta \theta}{2\pi TE}$$

a frequency drift can be determined in the form of a frequency shift Δv, where TE represents the chronological distance between the excitation pulse and the navigator signal. In this way, each individual spectrum can be corrected by Δv. Ideally, the phases of the various individual spectra are always compared with the same "reference" navigator signal (preferably of the first sequence pass). The precision depends on TE and is predicted with <±1 Hz.

In sum, the MR spectroscopy sequence according to the present invention represents only a slight modification of already-existing MRS sequences, with no effect or only a slight effect on the measurement time. In addition, the method according to the present invention does not adversely affect the spin history, i.e., only additional information is read out from existing sequential sequence steps. This additional information is finally used directly for the correction of the individual spectra, and ultimately provides better quality of the summed individual spectra.

Although modifications and changes may be suggested by those skilled in the art, it is the intention of the inventors to embody within the patent warranted hereon all changes and modifications as reasonably and properly come within the scope of their contribution to the art.

We claim as our invention:

1. Method for dynamic frequency detection of a resonance frequency in magnetic resonance spectroscopy, comprising the steps of:

in each of a plurality of successive magnetic resonance spectroscopy pulse sequence repetitions, acquiring a navigator signal at an identical point in time in each of said repetitions, and acquiring a spectrum;

determining a frequency shift of a resonance frequency from repetition-to-repetition by comparing the respective navigator signals; and correcting the respective spectrum obtained in each repetition dependent on said frequency shift.

2. A method as claimed in claim 1 comprising employing a pulse sequence with water suppression as said magnetic resonance spectroscopy pulse sequence.

3. A method as claimed in claim 2 comprising employing a multiple-pulse water suppression pulse sequence that includes a first RF saturation pulse, as said water suppression pulse sequence, and acquiring said navigator signal in each repetition after said first RF saturation pulse.

4. A method as claimed in claim 1 comprising acquiring said navigator signal with a duration of approximately 100 µs.

5. A method as claimed in claim 1 comprising acquiring said navigator signal through an analog-to-digital converter, and acquiring said navigator signal with a magnitude corresponding to ten measurement values of said analog-to-digital converter.

6. A method as claimed in claim 5 comprising averaging said ten measurement values of said analog-to-digital converter to form said navigator signal.

7. A method as claimed in claim 6 comprising averaging said analog-to-digital converter measurement values over all of said spectra.

8. A magnetic resonance spectroscopy apparatus comprising:

a magnetic resonance scanner, adapted to interact with an examination subject, to obtain magnetic resonance spectroscopy data from the subject;

a control unit for controlling said magnetic resonance scanner to emit a plurality of successive repetitions of a magnetic resonance spectroscopy pulse sequence, to acquire said magnetic resonance spectroscopy data as a spectrum for each repetition, and to acquire a navigator signal at an identical point in time in each of said repetitions; and a computer supplied with said magnetic resonance spectroscopy data that determines a frequency shift of a resonant frequency from repetition-to-repetition by comparing the respective navigator signals, and that corrects each spectrum dependent on said frequency shift.

* * * * *